United States Patent [19]

Taneya et al.

[11] Patent Number: 4,780,175
[45] Date of Patent: Oct. 25, 1988

[54] METHOD FOR THE PRODUCTION OF AN OPTICAL PHASE-SHIFTING BOARD

[75] Inventors: Mototaka Taneya, Sakura; Mitsuhiro Matsumoto; Sadayoshi Matsui, both of Tenri, all of Japan

[73] Assignee: Sharp Kabushiki Kaisha, Osaka, Japan

[21] Appl. No.: 113,003

[22] Filed: Oct. 26, 1987

[30] Foreign Application Priority Data

Oct. 27, 1986 [JP] Japan .............................. 61-256072
Oct. 29, 1986 [JP] Japan .............................. 61-257860

[51] Int. Cl.⁴ ...................... B44C 1/22; C03C 15/00; C03C 25/06
[52] U.S. Cl. .................... 156/633; 156/653; 156/657; 156/659.1; 156/667
[58] Field of Search ............ 156/629, 630, 633, 634, 156/653, 656, 657, 659.1, 667, 64, 292, 297; 357/19, 30; 372/8

[56] References Cited

U.S. PATENT DOCUMENTS

| | | | |
|---|---|---|---|
| 3,542,453 | 11/1970 | Kantor | 156/655 X |
| 4,343,890 | 8/1982 | Phillips et al. | 430/321 |
| 4,610,502 | 9/1986 | Nicia et al. | 156/659.1 X |
| 4,610,757 | 9/1986 | Khoe et al. | 156/659.1 X |

FOREIGN PATENT DOCUMENTS 1896934 5/1962 United Kingdom .

Primary Examiner—William A. Powell
Attorney, Agent, or Firm—Ciotti & Murashige, Irell & Manella

[57] ABSTRACT

A method for the production of an optical phase-shifting board comprising laying two or more layer-elements with different etching rates therebetween upon a substrate and then subjecting the substrate to an etching treatment so as to remove given portions of the layer-element with the highest etching rate that is disposed on the top of the layer-elements, resulting in the optical phase-shifting board, and a method for the fixation of the optical phase-shifting board to the stem comprising disposing molten light-sensitive or thermosetting resin in or on a guiding rail of the stem positioned in front of the light-emitting face of a semiconductor laser device, placing the optical phase-shifting board in or on the guiding rail of the stem, sliding the optical phase-shifting board in or on the guiding rail along the guiding rail while the far-field pattern of the semiconductor laser device is being monitored, stopping the sliding of the optical phase-shifting board in or on the guiding rail at the position where the far-field pattern conforms to a desired pattern, and curing the molten resin in or on the guiding rail to fix the optical phase-shifting board to the stem at said position.

7 Claims, 4 Drawing Sheets

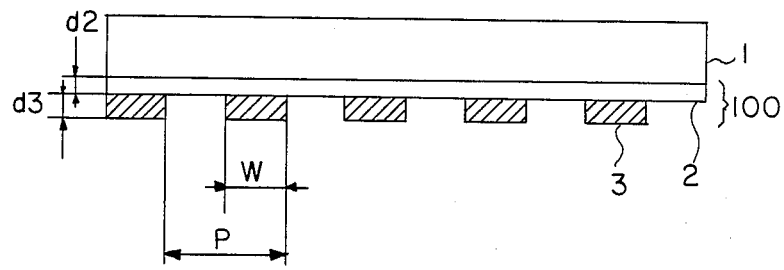
Fig. IA
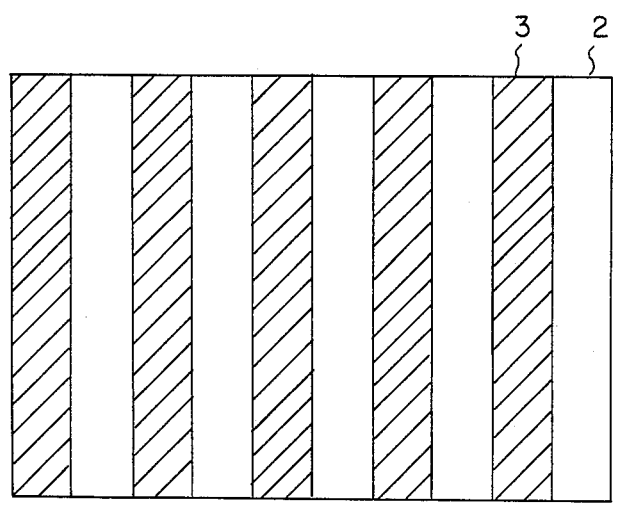
Fig. IB

METHOD FOR THE PRODUCTION OF AN OPTICAL PHASE-SHIFTING BOARD

BACKGROUND OF THE INVENTION

1. Field of the invention:

This invention relates to a method for the production of an optical phase-shifting board and a method for the fixation of the optical-shifting board to a semiconductor laser stem.

2. Description of the prior art:

Optical phase-shifting boards by which optical phase-shift between the laser beams emitted from a semiconductor laser array device can be attained are essential to the construction of an optical integrated circuit. FIG. 5 shows a conventional phase-shifting board attaining a 180° phase-shift, which is produced as follows: A glass substrate 201 is subjected to a photolithographic treatment, resulting in a striped pattern. The width W' of each stripe is 5 μm and the stripes have a pitch of 2 W' (i.e., 10 μm). The portions of the surface of the glass substrate which is not to be etched are coated wtih a photoresist. The glass substrate with such a striped pattern is then subjected to an etching treatment with an etchant that is a mixture of hydrofluoric acid, ammonium fluoride and water, resulting in a mesastriped pattern therein wherein the depth d' of the etched portions is set to meet the equation (1).

$$(n' - 1)d' = \frac{2m + 1}{2} \lambda \qquad (1)$$

wherein n' is the refractive index of the glass substrate, m is an integer such as 0, 1, 2, 3, . . . , and λ is the wavelength of light in the air.

Then, the photoresist is removed from the glass substrate, resulting in an optical phase-shifting board.

The quantitative control of the phase-shift by the optical phase-shifting board obtained by the above-mentioned method depends upon the depth d' of the etched portions of the glass substrate, and the scatter of the quantities of the phase-shift corresponds to that of the depth d'. It is extremely difficult to achieve a uniform etching process in the plane and to improve the reproducibility of the etchng process. Moreover, the etching process is complicated and needs skilled workers.

Another conventional phase-shifting board can be made by a method in which the refractive index of a glass substrate is changed using an ion-exchanging technique, but the depth of each striped groove that is formed by the ion-exchanging technique cannot be controlled.

On the other hand, semiconductor laser devices are widely used in optical measuring systems, optical communication systems, etc., in which laser beams from the semiconductor laser devices are formed into useful shapes by means of lenses and/or prisms. Especially, in order that the optical phase-shift between the adjacent laser beams just emitted from a semiconductor laser device is achieved, a near-field pattern must be formed using an objective lens and a phase-shifting board must be disposed at the position where the near-field pattern is formed as reported by, for example, J. R. Heidel et al., IEEE Journal of Quantum Electonis, Vol. QE-22, No. 6, pp 740–752 (1986). FIG. 6 shows the optical system that is constituted by the above-mentioned method, in which a laser beam emitted from a semiconductor laser device 1 converges on the optical axis of a lens 2 via the lens 2, and an optical phase-shifting board 3 is disposed at the point of convergence. However, this system is large and the optical elements constituting this optical system must be positioned with accuracy so as to align their optical axes. Moreover, the positional relationship among the semiconductor laser device 1, the lens 2 and the phase-shifting board 3 must be fixed, which causes difficulties in the miniaturization of this system and the stabilization of the performance of this system for a long period of time.

SUMMARY OF THE INVENTION

The method for the production of an optical phase-shifting board of this invention, which overcomes the above-discussed and numerous other disadvantages and deficiencies of the prior art, comprises laying two or more layer-elements with different etching rates therebetween upon a substrate and then subjecting the substrate to an etching treatment so as to remove given portions of the layer-element with the highest etching rate that is disposed on the top of the layer-elements, resulting in the optical phase-shifting board.

In a preferred embodiment, the thickness of the layer-element with the highest etching rate is set to be a value that corresponds to the quantities of an optical phase-shift to be attained by the optical phase-shifting board.

In a preferred embodiment, the ratio of the etching rate of the layer-element disposed on the top of the layer-elements to that of the layer-element disposed on the second from the top of the layer-elements is about 1:10.

In a preferred embodiment, the top layer-element and the second layer-element are made of $Si_3N_4$ and $SiO_2$, respectively.

A method for the fixation of an optical phase-shifting board of the stem, on which a semiconductor laser device is mounted, of this invention comprises disposing molten light-sensitive or thermosetting resin in or on a guiding rail of the stem positioned in front of the light-emitting face of the semiconductor laser device, placing the optical phase-shifting board in or on the guiding rail of the stem, sliding the optical phase-shifting board in or on the guiding rail along the guiding rail while the far-field pattern of the semiconductor laser device is being monitored, stopping the sliding of the optical phase-shifting board in or on the guiding rail at the position where the far-field pattern conforms to a desired pattern, and curing the molten resin in or on the guiding rail to fix the optical phase-shifting board to the stem at the position.

In a preferred embodiment, the guiding rail is a groove that is formed in the stem in a manner so as to be parallel to the light-emitting face of the semiconductor laser device. Alternatively, the guiding rail is an L-shaped portion that is formed in the stem in a manner so as to be parallel to the light-emitting face of the semiconductor laser device.

Thus, the invention described herein makes possible the objectives of (1) providing a method for the production of an optical phase-shifting board with uniform planes and excellent reproducilibity; (2) providing a method for the production of an optical phase-shifting board by which the quantitative control of an optical phase-shift between the laser beams from a semiconductor laser device can be achieved depending upon the thickness of a layer-element constituting the multi-layer disposed on a substrate of the said phase-shifting board but it is not achieved depending upon the depth of an etched portion of the substrate; (3) providing a method for the fixation of an optical phase-shifting board by which a compact optical system can be obtained and the stabilized phase-shifting operation can be attained in the said optical system; and (4) providing a method for the fixation of an optical phase-shifting board in which the optical phase-shifting board is incorporated into the semiconductor laser device, so that the alignment of the optical elements of this optical system is not required and the miniaturization of this optical system can be attained, and in addition, a desired far-field pattern of the semiconductor laser device can be easily obtained.

BRIEF DESCRIPTION OF THE DRAWINGS

This invention may be better understood and its numerous objects and advantages will become apparent to those skilled in the art by reference to the accompanying drawings as follows:

FIGS. 1(A) and 1(B), respectively, a side view and a plane view showing an optical phase-shifting board of this invention.

DESCRIPTION OF THE PREFERRED EMBODIMENTS

EXAMPLE 1

Figure 2:
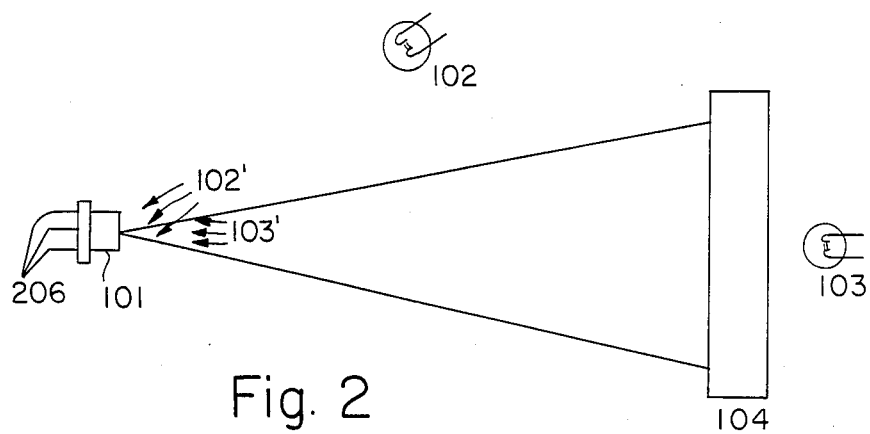
FIG. 2 is a diagram showing an apparatus for the fixation of the optical phase-shifting board to the stem on which a semiconductor laser device is mounted.

FIGS. 1(A) and 1(B) show an optical phase-shifting board of this invention comprising a glass substrate 1 and a multi-layer 100 disposed on the substrate 1, which is produced as followed: On a glass substrate 1 having a thickness of about 100-200 μm, a $SiO_2$ film 2 having a thickness of 1500 Å is disposed at a substrate temperature of 250° C. by a high frequency spattering technique. The thickness $d_2$ of the $SiO_2$ film 2 is set to be such a value that the $SiO_2$ film 2 can protect the glass substrate 1 from an etchant. Then, on the $SiO_2$ film 2, a $Si_3N_4$ film 3 is disposed by plasma assisted chemical vapor deposition, resulting in a multi-layer 100 on the substrate 1. The thickness $d_3$ of the $Si_3N_4$ film is set to meet the equation (2).

$$(n-1)d_3 = \frac{2m+1}{2}\lambda \qquad (2)$$

Wherein n is the refractive index of the $Si_3N_4$ film 3, m is an integer such as 0, 1, 2, 3, ..., and λ is the wavelength of light in the air.

Then, the portions of the $Si_3N_4$ film 3 are removed into a striped shape by photolithography and an etching technique using an etchant that is a solution in the proportion of 1 part hydrofluoric acid to 40 parts ammonium fluoride. Each of the remaining portions (i.e., the striped mesa portions) of the $Si_3N_4$ film 3 has a width of W and a pitch of P. The etching process is carried out at room temperatures. The relationship between the etching rate $R_{E(SiO2)}$ of the $SiO_2$ film 2, which is formed by the spattering vapor deposition method, to the etchant and the etching rate $R_E(Si_3N_4)$ of the $Si_3N_4$ film 3, which is formed by plasma assisted chemical vapor deposition, to the etchant is represented by the equation (3).

$$R_E(Si_3N_4) \gtrsim 60\, R_E(SiO_2) \qquad (3)$$

Accordingly, when the etching period of time is set to be under the optimum condition, the portions of the $Si_3N_4$ film 3 to be etched into a striped shape can be completely removed, without the removal of the $SiO_2$ film 2. The shift-quantities achieved by the resulting phase-shifting board depend upon the thickness $d_3$ alone of the $Si_3N_4$ film 3 formed by plasma assisted chemical vapor deposition, and when these film layers formed on the substrate 1 satisfy the equation (3), a 180° phase-shift can be attained by the phase-shifting board. The uniformity of the thickness $d_3$ of the film formed by plasma assisted chemical vapor deposition according to this example is surprisingly more excellent than that of the depth d' of the etched portion of a substrate of conventional phase-shifting boards. The thickness $d_3$ of the $Si_3N_4$ film 3 can be controlled in error by as small as ±2-3% when the substrate 1 is rotated during the formation of the $Si_3N_4$ film 3. Moreover, since the thickness of the film formed by plasma assisted chemical vapor deposition can be measured without an occurrence of breakage by an optical means prior to the etching process, the optimum thickness of the film can be obtained by an additional deposition of $Si_3N_4$ or an etching process on the whole area of the $Si_3N_4$ film. Accordingly, the phase-shifting board can be produced in a high yield and the reproducibility thereof is excellent.

The phase-shifting board produced by the above-mentioned method attains a conversion of oscillation laser beams with a 180° phase-mode from a semiconductor laser array device into oscillation laser beams with a 0° phase-mode, resulting in high output power laser beams. This invention is not limited to the phase-shifting board of this example, but it is also applicable to an optical phase-operating board such as a hologram, etc., in which the length of the interference between the phase-operating portion of the board and the light coming to the phase-operating portion must be controlled by the order of wavelength, attaining the production thereof in a high yield.

This invention is also applicable to the following cases:

(1) When the materials of the optical phase-shifting board are $Al_2O_3$, $Mg_2O_5$, $ZrO_2$, $Ta_2O_5$, $MgF_2$, $TiO_2$, etc., other than $SiO_2$ and $Si_3N_4$, (2) When the films are formed on the substrate by ECR plasma assisted chemical vapor deposition, electron beam vapor deposition, resistance heating vapor deposition, etc., (3) When the etchant is a wet etchant or a dry etchant such as $CF_4$ gas, $Cl_2$ gas, etc., and/or (4) When the film compositions change at the interface between the $SiO_2$ film and the $Si_3N_4$; for example, $SiO_2$ becomes $SiO_x$ (wherein $0 < x < 2$) and/or $Si_3N_4$ becomes $Si_3N_y$ (wherein $0 < y < 4$).

EXAMPLE 2

Figures 3A, 3B:
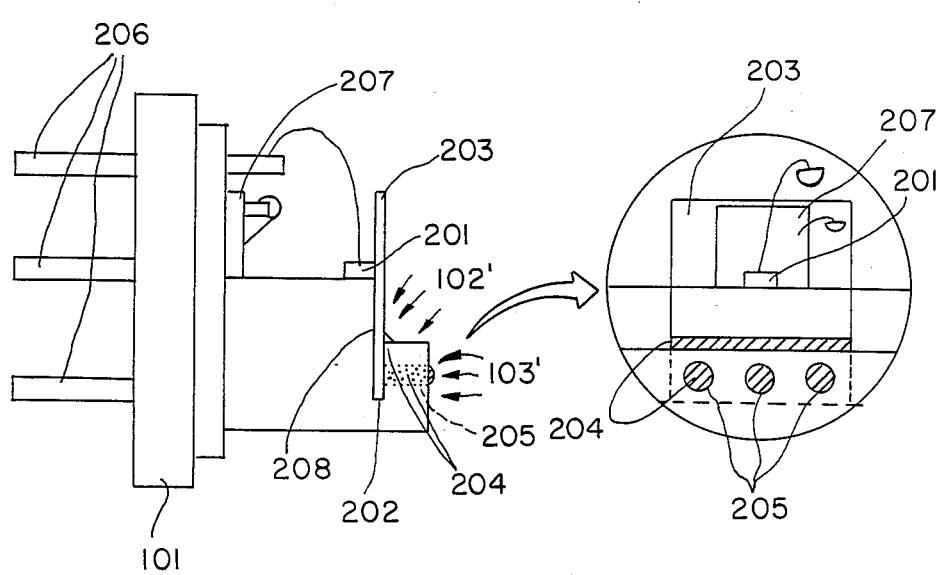
FIGS. 3(A) and 3(B), respectively, are a side view showing the stem to which the semiconductor laser device and the optical phase-shifting board are fixed, and a front view showing the enlarged part of the stem.

FIG. 2 shows an apparatus for the fixation of the optical phase-shifting board to a stem 101. FIG. 3(A) shows the stem 101 on which a semiconductor laser device 201 is mounted. The optical phase-shifting board 203 is fixed to the stem 101 as follows: The semiconductor laser device is mounted on the stem 101, first, and an amount of molten light-sensitive resin 204 is poured into a groove 202 of the stem 101 that is formed in front of the semiconductor laser device 201, after which the optical phase-shifting board 203 is placed in the groove 202. The width of the groove 202 is preferably set to be in the range of 1.2 to 1.5 times the thickness of the optical phase-shifting board 203, so that the movement of the board 203 in the groove 202 can be minimized. Windows 205, through which the light-sensitive resin 204 positioned within the groove 202 is irradiated by light, are disposed in the front face of the stem 101 as shown in FIG. 3(B). The windows 205 are also charged with an amount of light-sensitive resin 204.

Then, current is injected into the semiconductor laser device 201 via lead pins 206 of the stem 101, resulting in laser oscillation. The monitoring of optical output power is carried out using a solar battery device 207. A semiconductor laser array device that operates at a 100 mW output power is used as the semiconductor laser device 201. A device 104 for detecting an optical strength distribution of the semiconductor laser device 201 is disposed at a distance of about 10 cm from the stem 101 to thereby monitor the far-field pattern of the semiconductor laser device 201.

Then, the optical phase-shifting board 203 is slid in the groove 202 within the plane of the said board 203 until it comes to the position at which the far-field pattern of the semiconductor laser device 201 conforms to a desired pattern, and the light-sensitive resin 204 is irradiated by lamps 102 and 103. The resin 204 cures and the optical phase-shifting board 203 is fixed at its position in the groove 202. Since ultraviolet-sensitive resin that is sensitive to light with a wavelength of 300-400 nm is used as the light-sensitive resin 204, mercury lamps are used as the lamps 102 and 103.

The positional relationship between the optical phase-shifting board 203 and the semiconductor laser device 201, which is set by the above-mentioned way, gives a desired far-field pattern and does not change even when vibrations occur.

In order to minimize the occurrence of fluctuations of the positional relationship between the semiconductor laser device 201 and the optical phase-shifting board 203, it is preferable that the light-emitting face of the semiconductor laser device 201 is parallel to the rear face 208 of the groove 202 at a distance of 5 μm or less therefrom. It is also preferable that the distance of the light-emitting face of the laser device 201 from the optical phase-shifting board 202 is set to be 80 μm or less, which allows a miniaturization of the said system. Accordingly, the distance of the light-emitting face of the laser device 201 from the phase-operating portion of the optical phase-shifting board 202 is about 15 μm.

In this example, since the light-sensitive resin 204 is irradiated by lights 102' and 103' of the two lamps 102 and 103 from different directions, it effectively cures within the groove 202 that functions as a guiding rail of the board 203.

EXAMPLE 3

Figure 4:
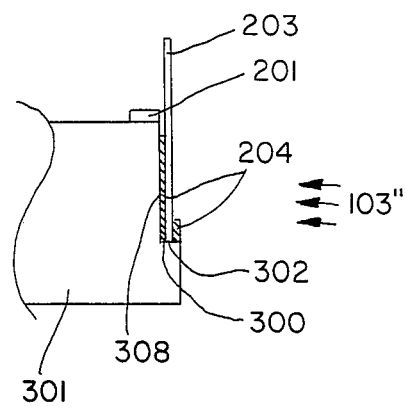
FIG. 4 is a diagram showing another stem of which the optical phase-shifting board is fixed according to this invention.
Figure 6:
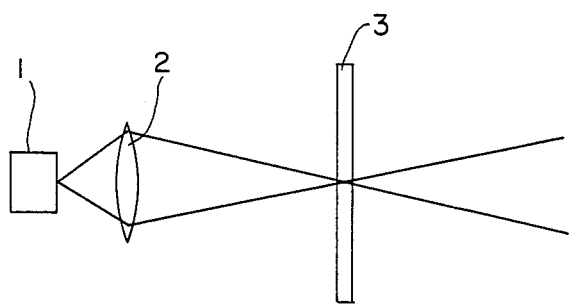
FIG. 6 is a diagram showing the configuration of a conventional optical system containing the phase-shifting board of FIG. 5.
Figure 5A:
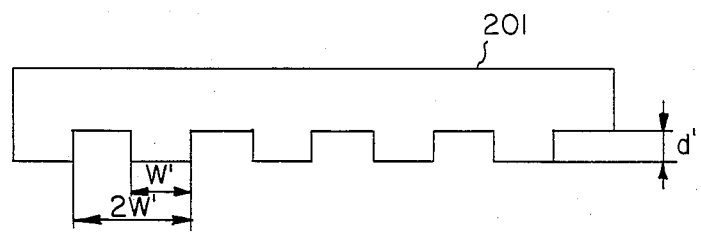
FIGS. 5(A) and 5(B), respectively, are a side view and a plane view showing a conventional optical phase-shifting board.
Figure 5B:
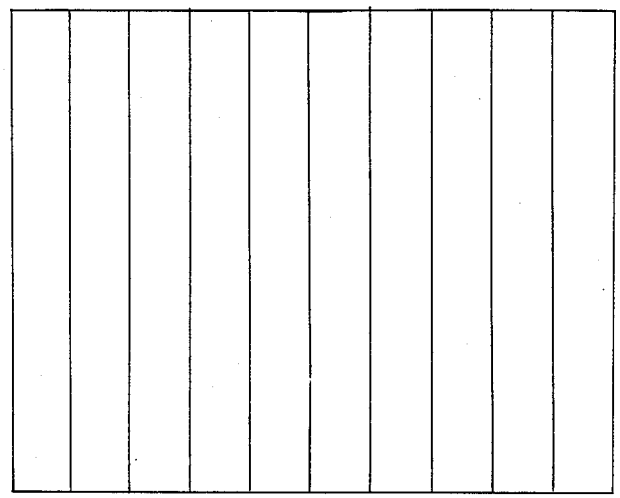

This example discloses a method by which the resin 204 is hardened by radiating light from one direction. According to this example, as shown in FIG. 4, the guiding rail is of an L-shaped portion 300 disposed in the stem 301. The L-shaped portion 300 is constituted by a vertical plane 308 vertical to the upper surface of the stem 301 on which the semiconductor laser device 201 is mounted and a horizontal plane 302 at a right angle to the plane 308. Light-sensitive resin 204 is disposed on both planes 302 and 308 of the L-shaped portion 300, and then the optical phase-shifting board 203 is shifted on the L-shaped portion 300 while it is brought into contact with the resin 204 on both planes 302 and 308 of the L-shaped portion 300 by means of a vacuum pump, etc. When the board 203 comes to the position at which the far-field pattern of the semiconductor laser device 201 conforms to a desired pattern, the sliding of the board 203 is stopped and the resin 204 is irradiated by light 103'' from one direction so as to arise the curing thereof. The whole area of the resin 204 can be irradiated by light 103'' in this example, so that the strength of the fixation of the board 203 to the stem 301 by the cured resin becomes greater than that of the fixation of the board 203 to the stem 101 in Example 2. Moreover, the use of only one radiating lamp is enough to cure the light-sensitive resin 204.

This invention is not limited to Examples 2 and 3, but it is also applicable to the following cases:

(1) When the optical phase-shifting board is disposed to be vertical to the plane of the junction of the semiconductor laser device, (2) When the optical phase-shifting board is disposed to be inclined to the light-emitting face of the semiconductor laser device, (3) When a device composed of a combination of slits and a solar battery is used as the monitoring device for monitoring the far-field pattern of the semiconductor laser device, (4) When thermosetting material is used instead of light-sensitive resin, and/or (5) When the optical phase-shifting board also works as a glass of the window of the stem, and it is fixed to the stem and attains a cap-sealing by means of light-sensitive or thermosetting resin.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of an optical phase-shifting board comprising laying two or more layer-elements with different etching rates therebetween upon a substrate and then subjecting said substrate to an etching treatment so as to remove given portions of the layer-element with the highest etching rate that is disposed on the top of the layer-elements, resulting in said optical phase-shifting board.

2. A method according to claim 1, wherein the thickness of said layer-element with the highest etching rate is set to be a value that corresponds to the quantities of an optical phase-shift to be attained by said optical phase-shifting board.

3. A method according to claim 1, wherein the ratio of the etching rate of said layer-element disposed on the top of the layer-elements to that of the layer-element disposed on the second from the top of the layer-elements is about 1:10.

4. A method according to claim 1, wherein the top layer-element and the second layer-element are made of $Si_3N_4$ and $SiO_2$, respectively.

5. A method for the fixation of an optical phase-shifting board to the stem on which a semiconductor laser device is mounted, which comprises disposing molten light-sensitive or thermosetting resin in or on a guiding rail of the stem positioned in front of the light-emitting face of the semiconductor laser device, placing the optical phase-shifting board in or on the guiding rail of the stem, sliding said optical phase-shifting board in or on the guiding rail along said guiding rail while the far-field pattern of the semiconductor laser device is being monitored, stopping the sliding of the optical phase-shifting board in or on the guiding rail at the position where said far-field pattern conforms to a desired pattern, and curing said molten resin in or on the guiding rail to fix said optical phase-shifting board to the stem at said position.

6. A method according to claim 5, wherein said guiding rail is a groove that is formed in the stem in a manner so as to be parallel to the light-emitting face of the semiconductor laser device.

7. A method according to claim 5, wherein said guiding rail is an L-shaped portion that is formed in the stem in a manner so as to be parallel to the light-emitting face of the semiconductor laser device.

* * * * *

UNITED STATES PATENT AND TRADEMARK OFFICE
CERTIFICATE OF CORRECTION

PATENT NO. : 4,780,175
DATED : 25 October 1988
INVENTOR(S) : Mototaka Taneya, Sakura; Mitsuhiro Matsumoto; Sadayoshi Matsui, both of Tenri, all of Japan It is certified that error appears in the above-identified patent and that said Letters Patent is hereby corrected as shown below:

IN CLAIM 3, LINE 5, AND AT COLUMN 2, LINE 31, "1:10" SHOULD READ --10:1--.

Signed and Sealed this

Sixteenth Day of January, 1990

*Attest:*

JEFFREY M. SAMUELS

*Attesting Officer*  *Acting Commissioner of Patents and Trademarks*